INTEGRATED IGFET LOGIC CIRCUIT WITH LINEAR RESISTIVE LOAD

Filed Feb. 3, 1965

INVENTOR.
MARTIN S. AXELROD

BY

S. P. Tedesco
ATTORNEY

United States Patent Office 3,406,298

Patented Oct. 15, 1968

3,406,298
INTEGRATED IGFET LOGIC CIRCUIT WITH LINEAR RESISTIVE LOAD

Martin S. Axelrod, North White Plains, N.Y., assignor to International Business Machines Corporation, New York, N.Y., a corporation of New York Filed Feb. 3, 1965, Ser. No. 430,146
14 Claims. (Cl. 307—251)

ABSTRACT OF THE DISCLOSURE

A logical circuit arrangement is described comprising insulated gate field effect transistors wherein the gate electrode of the load field effect transistor is independently biased such that the load transistor exhibits a substantially linear resistance.

This invention relates to logic circuits and, more particularly, to logic circuits comprising field-effect transistor devices wherein one such device is utilized as a resistive load.

The present trend in the electronics industry is toward the batch-fabrication of large numbers of active circuit devices of microminiature dimensions along with functional interconnections onto a single semiconductor wafer to form operative circuit arrangements. The objectives of industry are to reduce the size, weight, and unit cost of the active circuit devices, to overcome certain problems due to the complexity of present day electronics systems and, also, to improve reliability and power utilization from a system viewpoint. Batch-fabrication techniques find particular application in digital systems wherein a large redundancy of logic circuit blocks is required. A large number of these circuit blocks will be concurrently formed onto a single semi-conductor wafer, such wafer often forming an essential constituent of active circuit devices in the individual circuit blocks. It is contemplated that between 800 and 1000 circuit blocks will be functionally interconnected on a semiconductor wafer having a diameter of approximately 1 inch.

It is desirable that the number of distinct process steps required to fabricate the individual circuit blocks be minimal. To this end, the same basic device structures have been adapted to serve both as active and passive circuit devices, e.g., resistive loads, in the logic circuit block. However, the characteristics of such devices are not always such as to optimize circuit operation.

A solid-state device which has been described in the literature as particularly adapted to batch-fabrication is the insulated-gate field-effect transistor. The basic structure and a process for fabricating such field-effect transistors has been described, for example in Patent No. 3,386,163, issued on June 4, 1968, entitled, "Method for Fabricating Insulated-Gate Field Effect Transistor," for A. E. Brennemann et al., and assigned to a common assignee. Basically, an insulated-gate field-effect transistor comprises a metallic gate electrode spaced from the surface of a high resistivity semi-conductor material of first conductivity type by a thin layer of dielectric material; in addition, source and drain electrodes are defined in the semiconductor material by spaced surface portions of opposite conductivity type. Electrical fields generated by the gate electrodes, when biased, modulate majority carrier density along the opposing surface portion of the semiconductor material and, therefore, conduction between source and drain electrodes. The insulated-gate field-effect transistor, being a voltage-controlled device, is more the equivalent of a vacuum tube triode than of a current-controlled semiconductor transistor device.

In numerous logic circuit blocks disclosed in the prior art, field-effect transistors have been employed as resistive loads in circuit arrangements wherein other field-effect transistors of similar structure and geometry are adapted as active circuit devices. The dual role of such devices is very highly desirable because of the resulting simplicity of the fabrication process. In other words, both active circuit devices and resistive loads in the logic circuit block are formed concurrently such that the total number of process steps are minimal. However, the manner in which field-effect transistors have been adapted in circuit arrangements as resistive loads is such that the equivalent load resistance $R_L$ is not sufficiently linear to optimize circuit operations. In the prior art, the gate electrode is multipled either to the source or drain electrode of the load field-effect transistor. When source and gate electrodes are multipled, the load field-effect transistor operates essentially as a constant current source, source-drain current $I_{SD}$ being essentially constant for variations in source-drain voltage $V_{SD}$. Also, when drain and gate electrodes are multipled, the current-voltage characteristics of the load field-effect transistor very closely approximates those of a semiconductor diode device. For digital applications, the resulting nonlinear equivalent resistance $R_L$ of the load field-effect transistor is particularly undesirable from a viewpoint of circuit speed and power dissipation. The attainment of a substantially linear equivalent load resistance $R_L$ has not been achieved in prior art circuit arrangements.

Generally, field-effect transistors of a same operational mode, either depletion or enhancement, are formed concurrently on a single semiconductor wafer. The fabrication of field-effect transistors having different operational modes on a single semiconductor wafer is complicated and not easily achieved. In logic circuit arrangements, it is preferred in many instances that enhancement-type field-effect transistors be employed as active, or input, devices; accordingly, an enhancement-type field-effect transistor is usually available as the "load" in such arrangements. An enhancement-type field-effect transistor is defined as one wherein substantially no source-drain current $I_{SD}$ flows at zero-gate bias, a finite gate bias being required to support source-drain current $I_{SD}$. The ability to tailor the current-transfer characteristics of the enhancement-type field-effect transistor to define a substantially linear equivalent load resistance $R_L$ could achieve beneficial results by optimizing circuit operation from a speed and power dissipation viewpoint.

Accordingly, an object of this invention is to provide a novel logic circuit arrangement comprising field-effect transistors.

Another object of this invention is to provide a novel logic circuit arrangement comprising field-effect transistors whose operation is optimized from a speed and power dissipation viewpoint.

Another object of this invention is to provide a high-gain logic circuit arrangement comprising field-effect transistors.

Another object of this invention is to provide a novel logic circuit arrangement of field-effect transistors wherein the current-voltage characteristics of that field-effect transistor adapted as a load device is substantially linear.

Another object of this invention is to adapt a field-effect transistor as a resistive load, the equivalent resistance $R_L$ defined by such transistor being substantially linear.

Another object of this invention is to tailor the equivalent resistance $R_L$ defined by a load field-effect transistor.

The novel logic circuit of this invention is achieved by forming a parallel arrangement of active, or input, field-effect transistors, i.e., respective source and drain electrodes being multipled; the parallel arrangement of active field-effect transistors is connected in series with a load field-effect transistor. In accordance with particular aspects of this invention, the gate electrode of the load field-effect transistor is biased independently of either the source or drain electrode, gate bias being selected to shift the current-voltage characteristics and provide a substantially linear equivalent load resistance $R_L$. Normally, the current-voltage characteristic of a field-effect transistor, with gate electrode connected to drain electrode, is nonlinear and approximates that of a semiconductor diode device. However, by shifting the current-voltage characteristics of the load field-effect transistor by independently biasing the gate electrode, the equivalent resistance $R_L$ is defined by the substantially linear, low resistance portion of the current-voltage characteristic. As the slope of the low resistance portion of the current-voltage characteristic is a function of transconductance $g_m$, the geometry of the load field-effect transistor is particularly designed to achieve a desired circuit gain. Preferably, the load field-effect transistor is designed to exhibit a lower transconductance $g_m$ than the active field-effect transistors in the logic circuit arrangement whereby the equivalent load resistance $R_L$ is increased. Lower values of transconductance $g_m$ are achieved either by reducing the area of the load field-effect transistor, i.e., the length W of the diffused source and drain diffusions, or by increasing the spacing L between source and drain diffusions.

The foregoing and other objects, features and advantages of the invention will be apparent from the following more particular description of preferred embodiments of the invention, as illustrated in the accompanying drawings.

Figure 1:
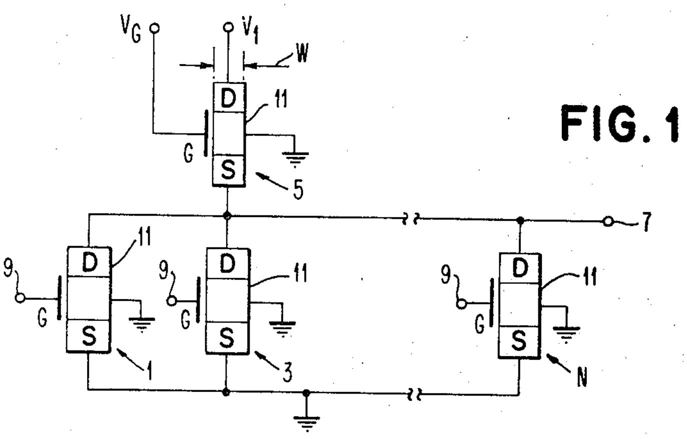
FIG. 1 shows a circuit arrangement for performing the logical NOR function comprising a plurality of field-effect transistors wherein one such transistor is adapted as a resistive load in accordance with the principles of this invention.

A logical circuit arrangement for performing the NOR function illustrated in FIG. 1 as comprising a plurality of NPN field-effect transistors 1, 3, . . . N arranged in parallel. The arrangement of FIG. 1 is for purposes of illustration only, the principles of this invention being applicable to numerous field-effect transistor arrangements for performing other logical functions, e.g., NAND, etc. Each transistor 1, 3, . . . N includes a drain electrode D, a source electrode S, and a gate electrode G. As illustrated, transistors 1, 3, . . . N are NPN-type and exhibit enhancement mode operation; a more complete description of the structure and operation of the field-effect transistor is set forth in the above-identified application. Source electrodes S of transistors 1, 3, . . . N are multipled to ground; the drain electrodes D of transistors 1, 3, . . . N are each connected at terminals 9 to a source electrodes S of the load transistor 5. The drain electrodes D of load transistor 5 are connected to a source of positive voltage $V_1$. An output terminal 7 is defined at the junction of the multipled drain electrodes D of transistors 1, 3, . . . N and the source electrodes S of load transistor 5 and connected to appropriate utilization circuits, not shown. Gate electrodes G of transistors 1, 3, . . . N are each conneced at terminals 9 to a source of information pulses, not shown. In the quiescent state, transistors 1, 3, . . . N are normally "turned off" whereby substantially no source-drain current $I_{SD}$ flows; also, load transistor 5 is conductive, as hereinafter described. Accordingly, during the quiescent state, the voltage appearing at output terminal 7 is positive and equal to voltage source $V_1$. When source and drain electrodes S and D, respectively, are appropriately biased, source-drain current $I_{SD}$ is primarily due to the action of electrical fields generated by the corresponding gate electrode G in modulating the majority carrier density along the intermediate semiconductive surface therebetween. Accordingly, a positive information pulse applied at one or more of input terminals 9 draws source-drain current $I_{SD}$ along the corresponding transistors 1, 3, . . . N whereby the voltage at output terminal 7 is reduced to substantially ground potential indicative of the generation of a logical NOR function.

For purposes of simplicity, the logic circuit arrangement of FIG. 1 is schematically illustrated; preferably, transistors 1, 3, . . . N and also load transistor 5 are formed by batch-fabrication techniques and in integrated fashion in the surface of a single semiconductor wafer symbolically illustrated by semiconductor bodies 11. For example, source and drain electrodes S and D, respectively, of each transistor 1, 3, . . . N and also load transistor 5 are defined by N-type diffusions in the surface of the P-type semiconductor wafer; also, the gate electrode G of transistors 1, 3, . . . N and also of load transistor 5 as well as the functional interconnections therebetween, not identified, are formed by standard metallization process over a thin dielectric layer, not shown, access to source and drain electrodes S and D, respectively, being had through ports appropriately etched in the dielectric layer. Each gate electrode G is registered in electrical field-applying relationship with that portion of the semiconductor wafer defined between corresponding source and drain electrodes S and D, i.e., the source-drain circuit, of corresponding transistors 1, 3, . . . N and load transistor 5.

To adapt load transistor 5 as a substantially linear resistive load, gate electrode G is independently connected to a positive voltage source $V_G$, semiconductor wafer 11 being appropriately grounded. More particularly, the logic circuit arrangement of FIG. 1 is distinguishable over prior art circuit arrangements in that gate electrode G of the load transistor 5 is independently biased by voltage source $V_G$ of greater magnitude than voltage source $V_1$ connected to the corresponding drain electrode D. Also, the load transistor 5 is particularly designed to exhibit a transconductance $g_m$ less than that of input transistors 1,3, . . . N. The independent biasing of gate electrode G of the load transistor 5 modifies the current-voltage characteristics (cf., FIGS. 2B and 3B) to exhibit substantially constant slope. Also, by designing load transistor 5 to exhibit a lower transconductance $g_m$, a higher value of equivalent resistance $R_L$ is achieved whereby the gain of the logic circuit arrangement is materially improved. The transconductance $g_m$ of a field-effect transistor device is proportional to $W/L$, where W is the length of the source and drain diffusions and L is the spacing therebetween. If the geometries, i.e., transconductance $g_m$, of transistors 1,3, . . . N and the load transistor 5 are identical, the voltage gain $A_v$ of the logic circuit arrangement of FIG. 1 would be less than unity. This is evident since the equivalent load resistance $R_L$ of load transistor 5 is less than $1/g_m$ and the voltage gain $A_v$, when the load transistor 5 is in the active region, is equal to $g_mR_L$. To achieve a larger equivalent load resistance $R_L$ and thereby increase circuit gain. $A_v$, the geometry of load transistor 5 is designed to exhibit a lower value of transconductance $g_m$. In FIG. 1, for exemple, the transconductance $g_m$ of load FET device 5 is reduced with respect to that of transistors 1,3, . . . N by reducing the length W of parallelly-diffused source and drain electrodes S and D, respectively. An alternate technique for lowering the transconductance $g_m$ is hereinafter described with respect to FIG. 3A by increasing the spacing L between parallelly-diffused source and drain electrodes S and D, respectively.

Figure 2A:
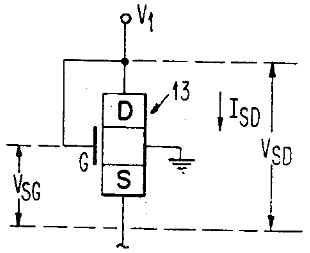
FIG. 2A PRIOR ART
FIG. 2A shows a prior art arrangement for adapting a field-effect transistor as a resistive load.
Figure 2B:
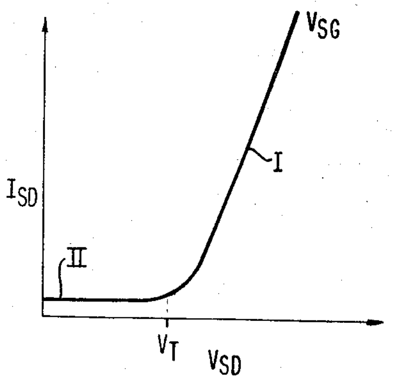
FIG. 2B PRIOR ART
FIG. 2B shows the current-voltage characteristics of the load field-effect transistor of FIG. 2A.

The advantages of independently biasing the gate electrode G of load transistor 5 can more fully be understood by a comparison of FIGS. 2A and 2B and FIGS. 3A and 3B, wherein parallel arrangement of active transistors 1, 3, . . . N are purposely omitted. The prior art technique of adapting an enhancement-type field-effect transistor 13 as a resistive load is illustrated in FIG. 2A. Generaly, gate electrode G is multipled to drain electrode D and connected to voltage source $V_1$ whereby source-gate voltage $V_{SG}$ and source-drain voltage $V_{SD}$ are equal. Accordingly, the current-voltage characteristics approximate those of a semiconductor diode as shown in FIG. 2B. Such characteristics exhibit a low-resistance portion I and a high-resistance portion II, the knee of the current-voltage characteristics occurs at voltage $V_T$ which is substantially equal to the source-gate voltage $V_{SG}$ required to "turn-on" load transistor 13. The resulting nonlinear equivalent resistance $R_L$ defined by load transistor 13, therefore, is not suitable for high speed operation.

Figure 3A:
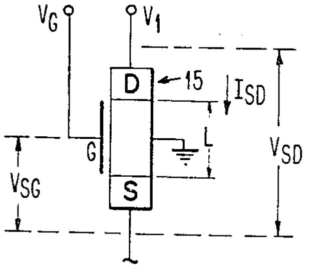
FIG. 3A shows an alternate arrangement for adapting a field-effect transistor as a resistive load in accordance with the principles of this invention.
Figure 3B:
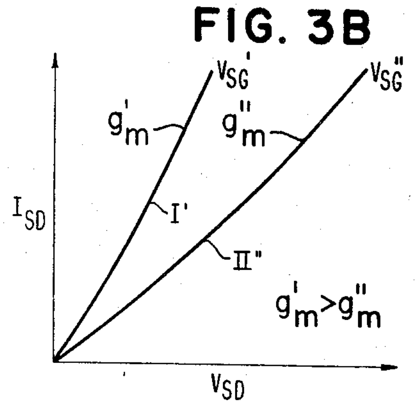
FIG. 3B shows the current-voltage characteristics of the field-effect transistor of FIG. 3A as a function of the independent gate bias.

The equivalent resistance $R_L$ presented by a field-effect transistor device is substantially linearized by independently biasing gate electrode G of load transistor 15 as illustrated in FIG. 3A. As shown in FIG. 3A, the gate electrode G of a load transistor 15 is connected to voltage source $V_G$. As hereinabove mentioned, the geometry of load transistor 15 is designed to exhibit a particular transconductance $g_m$ by increasing the spacing L between source and drain electrodes S and D. Voltage source $V_G$ is of greater magnitude than voltage source $V_1$, the difference between such voltage sources being substantially equal to or greater than the "turn-on" source-gate voltage $V_{SG}$ of load transistor 15. Biasing of gate electrode G by voltage source $V_G$ shifts the current-voltage characteristics of load transistor 15, as shown in FIG. 3B, whereby the equivalent resistance $R_L$ is defined by the low-resistance portion (curve I′) of the diode-type characteristics, for example, shown in FIG. 2B. The substantially linear equivalent resistance $R_L$ defined by load transistor 15 and illustrated by curve I′ improves circuit operation from a speed and power dissipation viewpoint. Also, to improve circuit gain $A_v$, transconductance $g_m$ of the load transistor 15 is tailored, i.e., reduced, by increasing the spacing L between the parallelly diffused source and drain electrodes S and D. The effect of lowering transconductance $g_m$ by design is to increase the equivalent resistance RL defined by load transistor 15. Tailoring of the transconductance $g_m$ of the device W varies the slope of the equivalent resistance $R_L$, as illustrated by curve I″ in FIG. 3B, to achieve a desired circuit gain $A_v$. It is evident that the current-voltage characteristics shown in FIG. 3B are equally applicable to load transistor 5 of FIG. 1.

Accordingly, the particular advantages of independently biasing gate electrode G of a field-effect transistor adapted as a resistive load, as shown in FIGS. 1 and 3A, is to substantially linearize the equivalent resistance $R_L$. Although an additional voltage source $V_G$ is required, there is no DC current drain on such voltage source and power requirements of the load circuit arrangement are not increased. In addition, tailoring the transconductance $g_m$ of such transistor provides a desired greater-than-unity circuit gain $A_v$. Accordingly, field-effect transistors exhibiting a same operational mode and fabricated by a single diffusion process can be formed in a logic circuit arrangement exhibiting greater-than-unity gain $A_v$.

While the invention has been particularly shown and described with reference to preferred embodiments thereof, it will be understood by those skilled in the art that various changes in form and details may be made therein without departing from the spirit and scope of the invention.

What is claimed is:

1. In combination, a circuit arrangement comprising at least one active circuit element, a first voltage source, and a substantially linear resistive load defined by a field-effect transistor device having a source-drain circuit and a gate electrode arranged in field-applying relationship therewith, the source-drain circuit of said transistor device being connected between said circuit arrangement and said first source, and biasing means including a second voltage source for independently biasing said gate electrode at a constant potential to define a substantially linear resistive load.

2. A logic circuit comprising a plurality of first field-effect transistor devices and a load field-effect transistor device each including a source-drain circuit and a gate electrode arranged in field-applying relationship therewith, means for connecting said source-drain circuits of said first devices in parallel arrangement, input terminal means connected to said gate electrodes of said first devices, a first voltage source, the source-drain circuit of said load device being connected between said first source and said parallel arrangement, output terminal means defined between said source-drain circuit of said load device and said parallel arrangement, and means including a second voltage source for independently biasing said gate electrode of said load device to define a substantially linear resistive load.

3. A logic circuit as defined in claim 2 wherein said load device exhibits a lower transconductance than that of said first devices.

4. A logic circuit as defined in claim 2 wherein said second source is of greater magnitude than said first source.

5. A logic circuit as defined in claim 4 wherein the difference in magnitude between said first and said second sources is substantially equal to the "turn-on" voltage of said load device.

6. A logic circuit as defined in claim 4 wherein the difference in magnitude between said first and said second voltage sources is greater than the "turn-on" voltage of said load device.

7. In a circuit arrangement, an operative arrangement of active devices, a source of operating voltage to be supplied to said operative arrangement, and a substantially linear resistive load connecting said source to said arrangement, said resistive load defined by a field-effect transistor device including a source-drain circuit and a gate electrode, said source being connected to said arrangement along said source-drain circuit of said device, said circuit arrangement being characterized by means for independently biasing said gate electrode of said device at a constant potential to exhibit a substantially linear equivalent resistance.

8. A logic circuit arrangement comprising a plurality of first field-effect transistor devices each including a source-drain circuit and a gate electrode, means for connecting said source-drain circuits in parallel arrangement, input terminal means connected to said gate electrodes, a first source of operating voltage, and an additional field-effect transistor device having source-drain circuit connected between said first source and said parallel arrangement and defining a resistive load, output terminal means defined between said source-drain circuit of said additional device and said parallel arrangement, said logic circuit arrangement being characterized by a second source of biasing voltage connected to said gate electrode of said additional device for biasing said additional device to define a substantially linear resistive load.

9. The logic circuit as defined in claim 8 wherein said additional device exhibits enhancement mode operation.

10. The logic circuit as defined in claim 8 wherein said plurality of first devices and said additional device exhibit enhancement mode operation.

11. The logic circuit as defined in claim 8 wherein source and drain diffusions defining said source-drain circuits of said plurality of first devices and said additional device are formed in a same semiconductor wafer, said source and drain diffusions and said wafer being of opposite conductivity type.

12. The logic circuit as defined in claim 11 wherein said additional device exhibits a lower transconductance $g_m$ than that of said plurality of first devices.

13. The logic circuit as defined in claim 12 wherein the length of source and drain diffusions defining said source-drain circuit of said additional device is less than that of said plurality of first devices, respectively.

14. The logic circuit as defined in claim 12 wherein the spacing between source and drain diffusions defining said source-drain circuit of said additional device is greater than that of said plurality of said first devices, respectively.

References Cited

UNITED STATES PATENTS

| | | | |
|---|---|---|---|
| 3,131,312 | 4/1964 | Putzrath | 307—251 X |
| 3,213,299 | 10/1965 | Rogers | 307—251 X |
| 3,260,948 | 7/1966 | Theriault. | |

ARTHUR GAUSS, *Primary Examiner.*

R. H. PLOTKIN, *Assistant Examiner.*